United States Patent [19]

Preisler et al.

[11] Patent Number: 5,371,068
[45] Date of Patent: Dec. 6, 1994

[54] PROCESS FOR PRODUCING TUBULAR MOLDED PARTS OF HIGH TEMPERATURE SUPERCONDUCTOR MATERIAL

[75] Inventors: Eberhard Preisler; Joachim Bock, both of Erftstadt; Johannes Holzem; Friedrich-Wilhelm Dorn, both of Hürth, all of Germany

[73] Assignee: Hoechst AG, Frankfurt am Main

[21] Appl. No.: 47,609

[22] Filed: Apr. 14, 1993

Related U.S. Application Data

[63] Continuation of Ser. No. 710,086, Jun. 4, 1991, abandoned.

[30] Foreign Application Priority Data

Jun. 18, 1990 [DE] Germany ............... 4019368

[51] Int. Cl.$^5$ .................................. H01L 39/12
[52] U.S. Cl. .................................. 505/450; 505/501; 264/235; 264/311; 264/332
[58] Field of Search ............... 264/332, 311, 346, 235; 505/1, 739, 740, 782, 450, 501

[56] References Cited

U.S. PATENT DOCUMENTS

| | | |
|---|---|---|
| 4,632,172 | 12/1986 | Etienne et al. .................. 164/301 |
| 5,047,391 | 9/1991 | Bock et al. .................... 505/1 |
| 5,171,735 | 12/1992 | Chien ......................... 505/1 |

FOREIGN PATENT DOCUMENTS 0344813 of 1989 European Pat. Off. .
3830092 3/1990 Germany .

Primary Examiner—Christopher A. Fiorilla
Attorney, Agent, or Firm—Connolly & Hutz

[57] ABSTRACT

To produce tubular molded parts made of high-temperature superconductor oxide material based on bismuth, calcium, strontium and copper, a homogeneous melt of the oxide with a specified stoichiometry is allowed to run at temperatures of 900° to 1100° C. into a casting zone rotating about its horizontal axis. The solidified molded part is removed from the casting zone and it is annealed for 4 to 150 hours at 700° to 900° C. in an oxygen-containing atmosphere. A plant for producing tubular molded parts includes a rotatably arranged mold (4, 9) which is provided at least at one end face with a front plate 6 which reduces its free cross section, a runner 7 extending into the interior of the mold (4, 9) and a crucible 8 arranged above the runner 7 which is capable of feeding the runner 7 with melt (cf. FIG. 2 A).

4 Claims, 5 Drawing Sheets

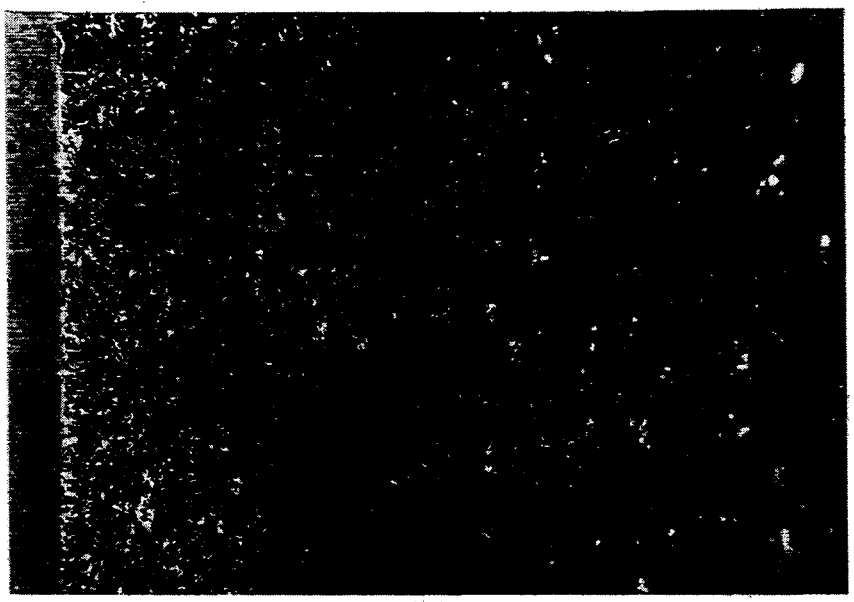
1300°C  Fig. 1C.
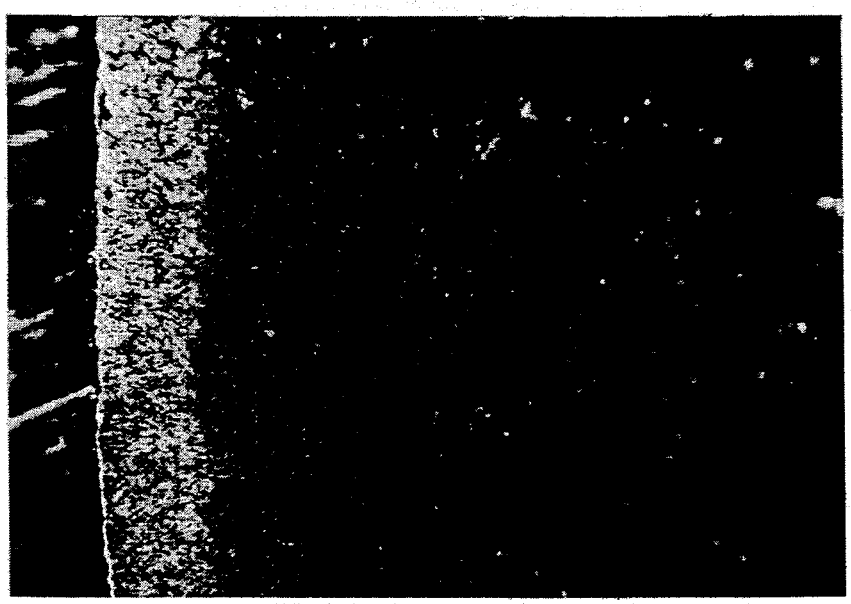
1100°C  Fig. 1B.
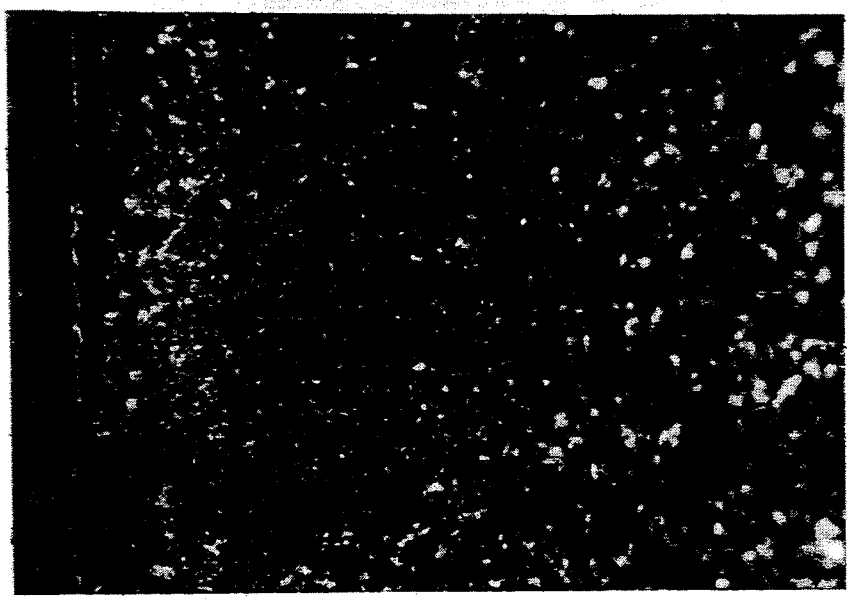
1000°C  Fig. 1A.

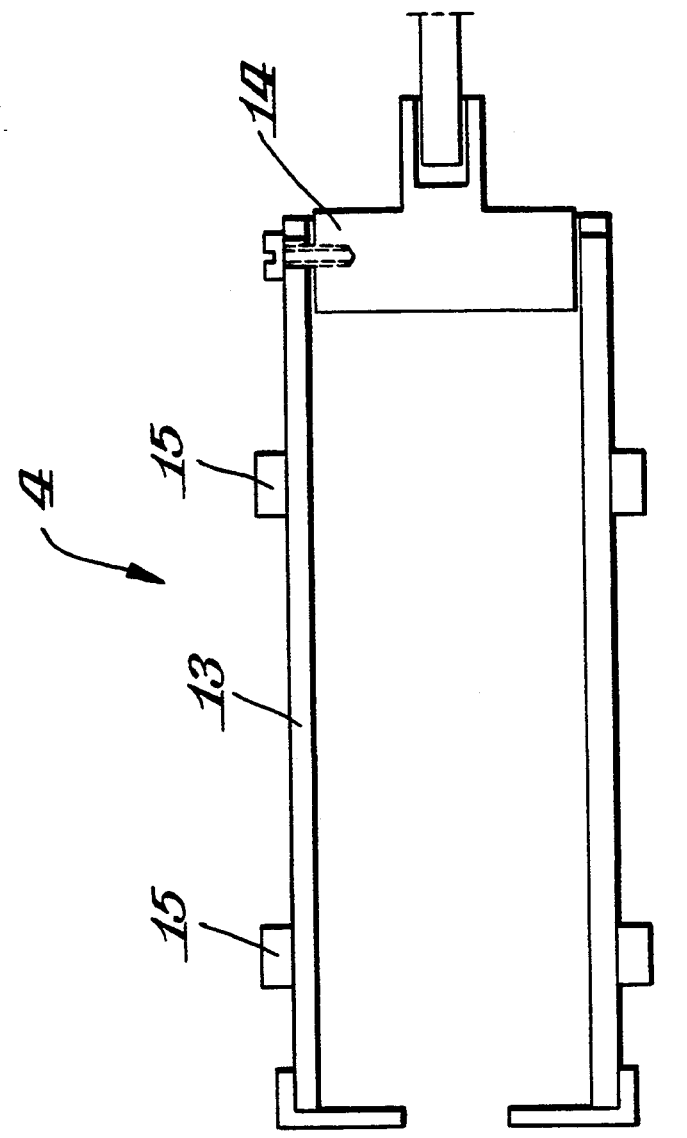
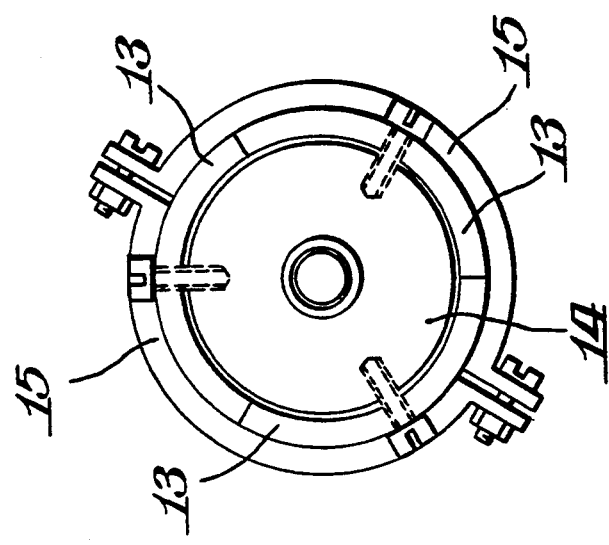
Fig. 3B.
Fig. 3A.

PROCESS FOR PRODUCING TUBULAR MOLDED PARTS OF HIGH TEMPERATURE SUPERCONDUCTOR MATERIAL

This application is a continuation of application Ser. No. 07/710,086 filed on Jun. 4,1991 now abandoned.

The present invention relates to a process for producing tubular molded parts made of high-temperature superconductor material based on oxides of bismuth, calcium, strontium and copper, and also to a plant for carrying it out.

It is known to produce products made of superconducting material by casting from a melt of superconducting material, in particular from a melt of the compound $Bi_2Sr_2CaCu_2O_x$ (cf. German Offenlegungsschrift 3,830,092). The present invention relates, however, to all bismuth-containing compositions which can be melted and reconverted to the superconducting state after casting by a suitable heat treatment, for example even to the lead-containing compound $(Bi,Pb)_2Sr_2Ca_2Cu_3O_{10}$ which is known as a three-layer compound.

For practical applications, these compounds, which have a ceramic nature as oxides, have to be converted into shapes which fulfil the intended application purpose. Some specific electrotechnical applications envisage cylindrical hollow shapes of various dimensions, inter alia, thick-walled tubes having comparatively small diameter and fairly long length, which can be used in high-frequency engineering. Such products can be produced by casting into rods but these have to be opened up by drilling later. However, for fairly large dimensions this technique encounters appreciable difficulties because solid castings readily develop internal stresses on cooling and these result in cracks which make such work pieces unusable. The material loss on drilling to produce tubes having large diameters and small wall thicknesses also reduces the cost effectiveness.

The object set requires tubular pieces made of superconducting material having diameters of over 20 mm to 500 mm and wall thicknesses which may vary within relatively wide limits (a few mm to cm), and of various lengths.

However, the so-called centrifugal casting process for producing tubes made of cast iron is known from foundry practice. In this process, a ceramic tubular mold is mounted rotatably and moved over a runner matching the length of tube to be produced. The mold is then caused to rotate and as the cast iron melt is poured out, it is withdrawn more or less rapidly depending on the desired tube thickness. The tube is thus produced by "winding on" the solidifying cast iron. After it has cooled, the tube is pulled out of the mold.

Superconductors are ceramic materials from which molded bodies are produced, as a rule by ceramic methods such as pressing the powders and sintering the same, in modest dimensions owing to the compaction pressures required. It has already been possible to show, however, that melt synthesis, which makes a casting technique possible, results in substantially better superconducting properties of the so-called two-layer compound $Bi_2Sr_2CaCu_2O_x$, namely simplified production, improved phase purity and good critical values (Tc, jc; cf. J. Bock and E. Preisler, Solid State Communications, Vol. 72, No. 5, pages 453-458 (1989) and M. Peuckert et al., Physica C 162-164 (1989), 893-894). It now proves to be particularly advantageous to use said casting technique in the form of the centrifugal casting technique if cylindrical hollow bodies are involved.

In particular, the present invention relates to a process for producing tubular molded parts made of high-temperature superconductor material based on oxides of bismuth, calcium, strontium and copper, which comprises producing a homogeneous melt of the oxide mixture with a specified stoichiometry, allowing the melt to run at temperatures of 900° to 1100° C. into a casting zone rotating about its horizontal axis, removing the solidified molded part from the casting zone and annealing the molded part for 4 to 150 hours at 700° to 900° C. in an oxygen-containing atmosphere.

The process according to the invention can furthermore optionally be developed as one wherein a) the stoichiometry is specified in accordance with the formula $Bi_2Sr_2CaCu_2O_x$, where x stands for values between 8 and 8.5;

b) the stoichiometry is specified in accordance with the formula $(Bi,Pb)_2Sr_2Ca_2Cu_3O_x$, where x stands for values between 10 and 13;

c) the casting zone is allowed to rotate at 300 to 1200 rev/min, preferably at 400 to 600 rev/min.

The invention furthermore relates to a plant for carrying out said process, comprising a rotatably arranged casting mold which is provided at each of its open end faces with a front plate which reduces the free cross section, a runner projecting into the interior of the casting mold and a reservoir which is arranged above the runner and which is capable of feeding the runner with melt.

The said plant can also be further developed as one wherein d) the casting mold can be controllably driven;

e) the casting mold is linked non-positively to a shaft running parallel to the casting floor, optionally in a shaft bearing, which is in its turn linked to a controllable motor;

f) the casting mold is rotatably mounted in a controllable drive and is held in its position by a counter-pressure roller;

g) the casting mold is closed at one of its end faces and is provided at its open end face with a front plate which reduces its free cross section;

h) the casting mold is made up of a plurality of segments which extend in its longitudinal axis and which are held together by a plurality of clamping rings engaging around its circumference;

i) the casting mold has a step on the internal wall of one of its ends, while the front plate at its opposite end has a larger recess pointing inwards;

j) the step is formed by inserting a ring;

k) the casting mold is composed of metallic material at least in the region of its internal wall;

l) the material is stainless steel according to DIN 17 440, in particular material No. 1.4571;

m) the material is nonferrous metal, in particular nickel and/or copper.

Since the material to be molded is ceramic, it is necessary, in the process in accordance with the invention, to choose a metallic mold instead of a ceramic one in order to exclude the possibility of a reaction of the melt with the ceramic wall of the mold. Such a reaction would in fact make the removal of the cast body substantially more difficult, if not quite impossible. Surprisingly, however, it was possible to pull the solidified cast body out of the mold without the mold walls being inclined with respect to the axis of rotation of the mold. As a result of the shrinkage of the hot melt on solidification and the further cooling, the diameter of the cast body decreases by a small amount which is, however, adequate for its complete detachment from the mold wall. It is, however, also possible to give the mold a slightly conical shape in order to facilitate the removal further if the requirements of the application purpose per,nit such a conical shape.

In the process according to the invention, a particular advantage of the metallic mold is its good thermal conductivity. It has been found that the mold does not normally have to be preheated. As the melt flows in, it solidifies very rapidly in a very thin layer as a result of the cooling due to the mold, said thin layer having a glassy nature, whereas the great bulk of the solidified material has a heterogeneous structure. The rapid cooling virtually completely prevents a reaction of the melt with the mold material.

The removal of the cast body from the mold is all the more easily possible in the process according to the invention, the shorter the mold is in comparison with its diameter and the more stable the cast body. The stability of the cast body depends both on its dimensions and on any internal stresses which may occur during cooling. Said internal stresses have something to do with the nature of the crystal formations. Said crystal formations, and consequently also the occurrence of the internal stresses, are evidently connected with the temperature of the melt and with the duration of fusion. Since the temperature, like the duration of fusion, has an effect on the oxygen content of the melt, it is to be presumed that the oxygen content also affects the structure. It can be seen from FIG. 1 how the appearance of the solidified melt changes with the melt temperature. From this it emerges that the melt temperature should not rise above 1050° C. before the compound $Bi_2Sr_2CaCu_2O_x$ is cast.

In the plant for carrying out the process according to the invention, the one-sided mounting of the mold can result in difficulties in the case of relatively elongated molded bodies and correspondingly long molds. In this case it is appropriate to support the holding of opposite ends of the mold by a roller bearing or to use the arrangement shogun in FIG. 2B for a free-rolling mold.

In addition to polished specimens of molded bodies produced according to the invention and a resistance-temperature curve, the accompanying drawing shows diagrammatically and in section a plant for carrying out the process according to the invention. In the drawing:

FIG. 1 shows microscopic polished specimens of sections through molded bodies of the composition $Bi_2Sr_2CaCu_2O_x$, which had been heated to 1000° and 1100° and 1300°, respectively, before they solidified;

FIG. 3 shows a mold made up of segments (in longitudinal and cross section);

Figure 2A:
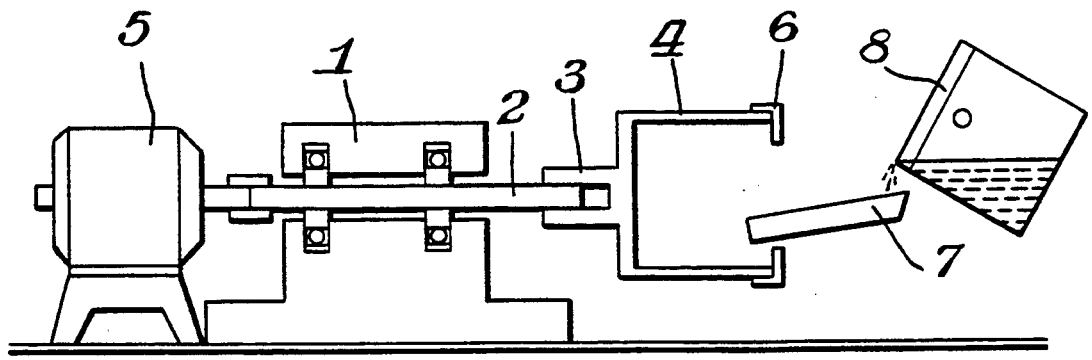
FIG. 2A shows a centrifugal casting apparatus in which the mold is pushed onto a rotating shaft.

According to FIG. 2A, one end of a shaft 2 located in a shaft bearing 1 is pushed into the centrically arranged extension 3 of a mold 4, while the opposite end of the shaft 2 is non-positively linked to a controllable electric motor 5. A front plate 6 is pushed onto the open end of the mold 4. Extending into the open end of the mold 4 is a runner 7 which can be fed with melt from a crucible 8.

Figure 2B:
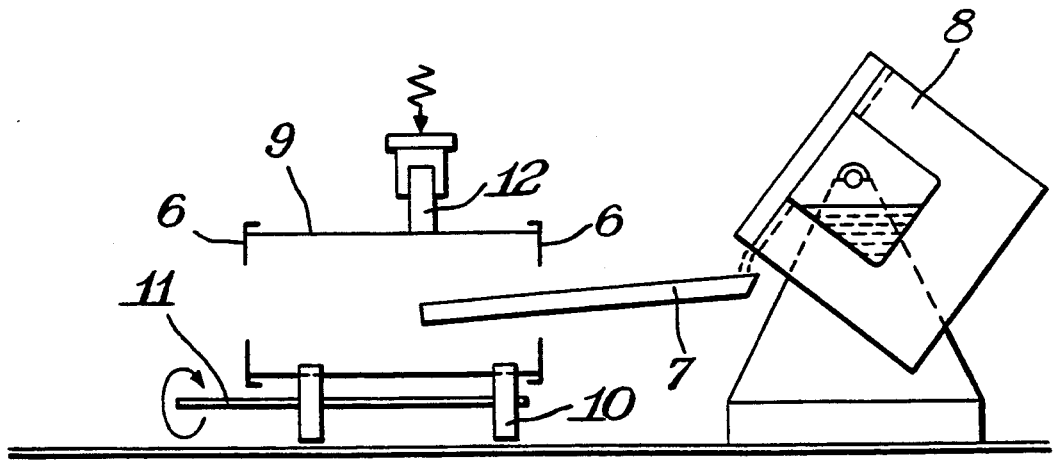
FIG. 2B shows a centrifugal casting apparatus in which the mold rests on rotating rollers.

According to FIG. 2B, an elongated mold 9 open on both sides is placed on shafts 11 provided with rollers 10, one of the shafts 11 being linked non-positively to a controllable drive which is not shown. Resting on the top of the mold 9 is a counterpressure roller 12. A front plate 6 is pushed onto each of the two open ends of the mold 9. A runner 7 which can be fed with melt from a crucible 8 extends into the mold 9.

According to FIG. 3, the mold 4 which can be used in the apparatus in accordance with FIG. 2A is made up of three segments 13 for the purpose of facilitating removal of the cylindrical molded part, the segments 13 being screwed to the mold base 14 and held together by clamping rings 15.

Figure 4A:
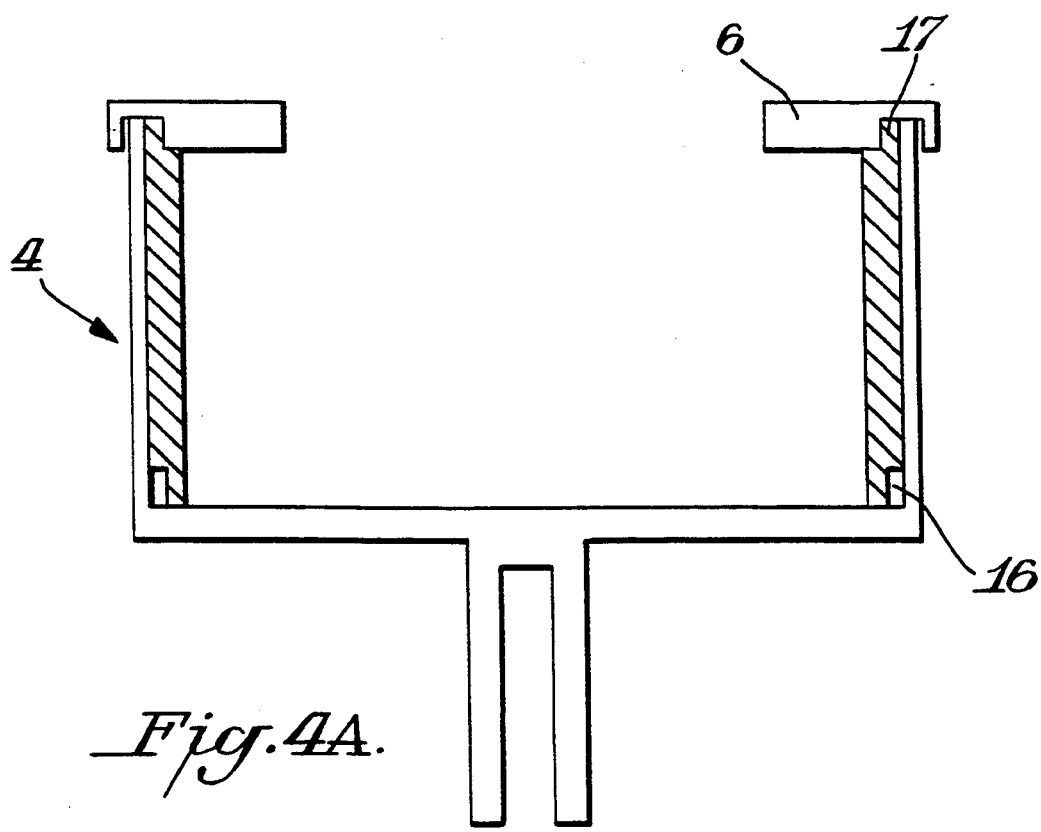
FIG. 4A shows a special design of the mold in accordance with FIG. 2A.
Figure 4B:
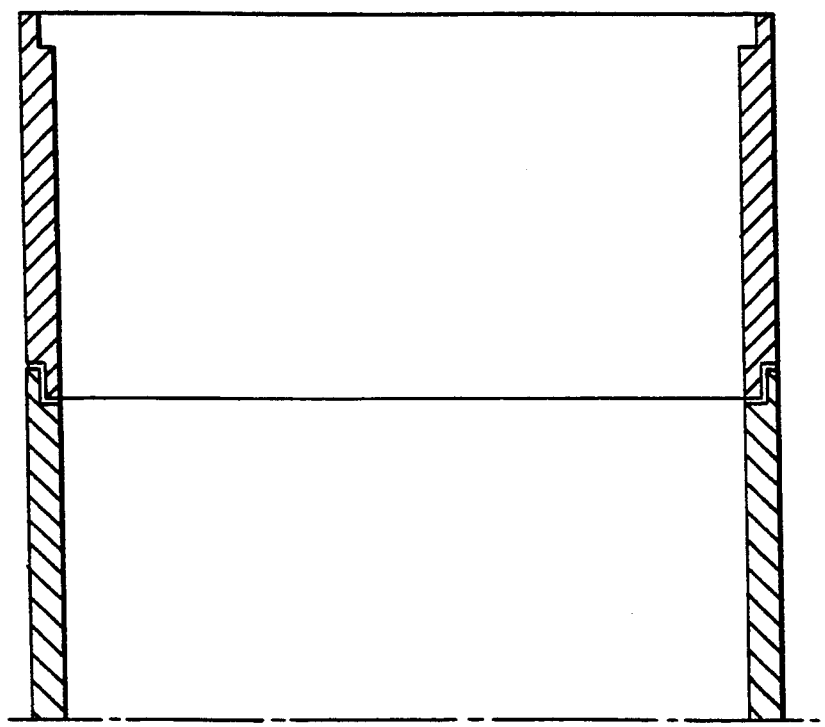
FIG. 4B shows molded parts which can be mounted one on the other and which are obtained in using the mold in accordance with FIG. 4A.

According to FIG. 4A, a ring 16 is inserted into the mold 4, which can be used in the apparatus in accordance with FIG. 2A, at its side opposite the opening. Furthermore, an annular groove 17 is incorporated in the front plate 6 of the mold 4, the width of which annular groove is greater than the wall thickness of the mold 4. The cylindrical molded bodies which can be produced with the aid of the mold 4 equipped in this way are so constructed at their top and bottom end that they can be stacked one on the other according to the principle of groove and tongue (cf. FIG. 4B).

EXAMPLE 1

Attached to the shaft of a stable bearing was, at one end, a controllable electric motor and, at the other end, a mold made of stainless steel in accordance with material No. 1.4571 according to DIN 17 440 (cf. FIG. 2A). The mold comprised a centric pot having a wall thickness of 1 mm which bore a ring for the purpose of closure which served to prevent a melt introduced from running out of the pot. The arrangement was so constructed that the rotational axis of the pot is horizontal. The pot had a diameter of 10 cm and a height of 11 cm. The front plate had a width of 10 mm calculated inwards from the casing of the pot. A runner made of copper sheet extended into the interior of the pot (cf. FIG. 2A).

800 g of the two-layer compound $Bi_2Sr_2CaCu_2O_x$ were fused in an aluminum oxide crucible and held at a temperature of 1030° C. for 20 minutes. Then the pot was brought up to a rotational speed of 500 revolutions per minute (rev/min) and the melt was discharged onto the runner. As a consequence of the centrifugal force, the melt distributed itself uniformly on the pot wall and solidified in a short time.

Figure 5:
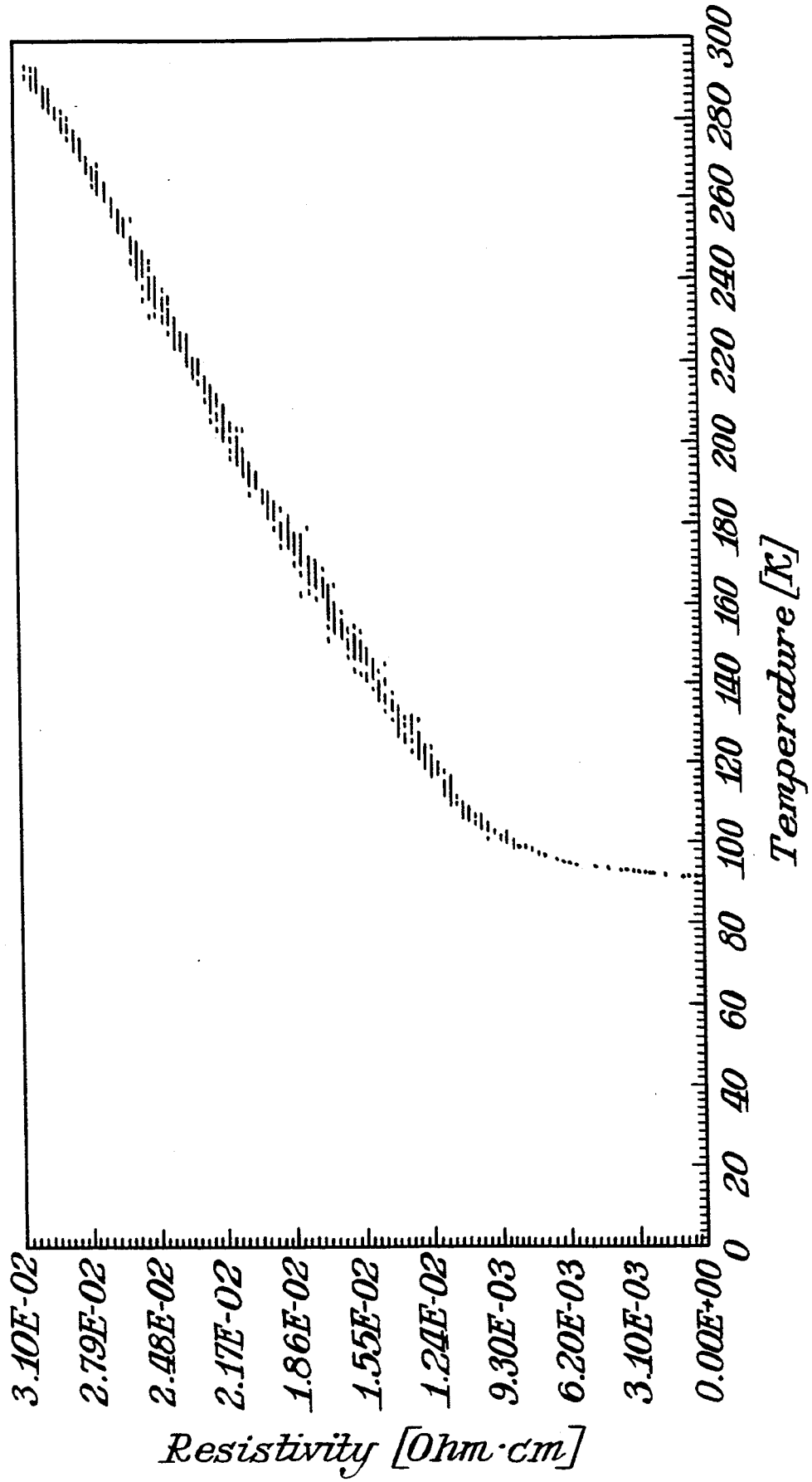
FIG. 5 shows a resistance-temperature curve of the material of which the cylindrical cast body obtained in accordance with Example 1 consisted.

After cooling and removing the ring, it was possible for the cylindrical cast body to be removed from the pot without difficulty. In this state it was not superconducting. After a heat treatment (24 h at 750° C. and 120 h at 850° C., with a heating-up rate of 40°/h), the cast body was superconducting, as emerges from the resistance curve in accordance with FIG. 5, according to which the complete loss of resistance set in at 90 K.

The dimensions of the cast body were:
External diameter: 100 mm
Internal diameter: 92 mm Height: 110 mm

EXAMPLE 2

Example 1 was repeated with the modification that the melt temperature was increased to 1100° C. The result was similar to that of Example 1, but, in the three casting experiments, one cast body had a crack and was therefore unusable.

EXAMPLE 3

The plant used in Example 1 was modified so that the axis of rotation of the mold pot was inclined at about 15° C. to the horizontal. Under otherwise comparable conditions to those in Example 1, a cylindrical molded body was obtained at 500 revolutions per minute whose external diameter was 100 mm on both sides but whose thickness was 5.5 mm at the base side and only 2.5 mm at the ring side as a consequence of gravity.

EXAMPLE 4

Example 3 was repeated with the modification that the rotational velocity was 800 revolutions per minute. As a result of this, the difference in thickness between the ends of the cylindrical cast body was almost equalized, but it was still 1 mm.

EXAMPLE 5

The plant used in Example 3 was modified by using a mold pot which had a slightly conical wall and whose diameter was 19 mm at the base and 21 mm at the top. In this case, a slightly conical cast body whose wall thickness was almost the same at top and bottom was obtained.

EXAMPLE 6

Example 1 was repeated with the modification that only 500 g of melt were cast. A cylindrical molded body was obtained which had a wall thickness of 2.5 mm and which it was possible to remove from the mold without difficulty.

EXAMPLE 7

Use was made of a plant in accordance with FIG. 2A whose rotatable mold made of stainless steel in accordance with material No. 1.4571 according to DIN 17 440 had an internal diameter of 200 mm and a height of 75 mm, it being possible to rotate the mold by means of the motor in the range from 300 to 1200 rev/min. With an amount of melt of 1500 g, a crack-free cylindrical cast body was produced which had dimensions of 200 mm diameter, 75 mm height and 3.2 mm thickness.

EXAMPLE 8

In a plant in accordance with FIG. 2A, a mold made of copper and having an external diameter of 40 mm and a length of 100 mm and also a front plate having an opening of 20 mm was used and was rotated at a rotational speed of 800 rev/min. 500 g of melt yielded a hollow cylinder with a wall thickness of 10 mm. However, it was not possible to remove this cast body from the mold.

EXAMPLE 9

Example 8 was repeated with the modification that a copper mold of the same dimensions was used which was made up of three segments which were held together by two outer clamping rings (cf. FIG. 3). Although there were no sealing elements between the segments, no melt ran out of the mold since the rapid solidification of the melt at the cold mold wall had an immediate sealing action on the mold. After removing the clamping rings it was possible to lift the segments easily off the cast body.

EXAMPLE 10

Example 7 was repeated with the modification that a mold with front plate in accordance with FIG. 4 was used. After casting 900 g of melt, a cylindrical cast body was obtained which had profiles at the upper and lower edges, which profiles made it possible to stack a plurality of such cylinders one on top of the other without gaps remaining free between them. Such groups of cylinders are particularly well suited for the construction of magnetic screens.

We claim:

1. A process for producing a tubular ceramic molded part having a diameter of 20 to 500 mm and being made of a high-temperature superconductor compound comprising bismuth, calcium, strontium and copper, which comprises producing a homogeneous melt of said high temperature superconductor compound with a specified stoichiometry; allowing the melt to run at temperatures of 900° to 1100° C. into a not preheated, metallic casting mold rotating at 300 to 1200 rev./min. about its horizontal axis with the resultant formation of a solidified ceramic molded part provided with a thin glassy layer arranged at its circumference; removing the solidified ceramic molded part from the metallic casting mold; and annealing the molded part for 4 to 150 hours at 700° to 900° C. in an oxygen-containing atmosphere.

2. The process as claimed in claim 1, wherein the stoichiometry is specified in accordance with the formula $Bi_2Sr_2CaCu_2O_x$, where x stands for values between 8 and 8.5.

3. The process as claimed in claim 1, wherein the stoichiometry is specified in accordance with the formula $(Bi,Pb)_2Sr_2Ca_2Cu_3O_x$, where x stands for values between 10 and 13.

4. A process as claimed in claim 1, wherein the metallic casting mold is allowed to rotate at 400 to 600 rev./min.

* * * * *